US008890239B2

(12) United States Patent
Yaegashi et al.

(10) Patent No.: US 8,890,239 B2
(45) Date of Patent: Nov. 18, 2014

(54) SEMICONDUCTOR DEVICE AND METHOD FOR PRODUCING THE SAME

(75) Inventors: Seiji Yaegashi, Tokyo (JP); Makoto Kiyama, Itami (JP); Mitsunori Yokoyama, Tokyo (JP); Kazutaka Inoue, Yokohama (JP); Masaya Okada, Osaka (JP); Yu Saitoh, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/884,221

(22) PCT Filed: Jul. 26, 2011

(86) PCT No.: PCT/JP2011/066885
§ 371 (c)(1),
(2), (4) Date: May 8, 2013

(87) PCT Pub. No.: WO2012/063529
PCT Pub. Date: May 18, 2012

(65) Prior Publication Data
US 2013/0248876 A1     Sep. 26, 2013

(30) Foreign Application Priority Data

Nov. 8, 2010   (JP) ................................ 2010-250076

(51) Int. Cl.
| | |
|---|---|
| H01L 29/66 | (2006.01) |
| H01L 29/778 | (2006.01) |
| H01L 29/417 | (2006.01) |
| H01L 29/78 | (2006.01) |
| H01L 29/06 | (2006.01) |
| H01L 29/423 | (2006.01) |
| H01L 29/20 | (2006.01) |

(52) U.S. Cl.
CPC ........ *H01L 29/7802* (2013.01); *H01L 29/7789* (2013.01); *H01L 29/66462* (2013.01); *H01L 29/66712* (2013.01); *H01L 29/41741* (2013.01); *H01L 29/7788* (2013.01); *H01L 29/0657* (2013.01); *H01L 29/0649* (2013.01); *H01L 29/4236* (2013.01); *H01L 29/2003* (2013.01)
USPC ...... 257/330; 257/302; 257/76; 257/E27.091; 257/E29.257

(58) Field of Classification Search
USPC ............. 257/330, 302, 76, E27.091, E29.257
See application file for complete search history.

(56) References Cited

U.S. PATENT DOCUMENTS

| | | | | |
|---|---|---|---|---|
| 7,592,647 | B2 * | 9/2009 | Nakata et al. .................. | 257/194 |
| 2009/0278197 | A1 * | 11/2009 | Ohta et al. ..................... | 257/330 |

FOREIGN PATENT DOCUMENTS

| | | |
|---|---|---|
| JP | 06-334503 A | 12/1994 |
| JP | 2000-349092 A | 12/2000 |

(Continued)

OTHER PUBLICATIONS

International Search Report in PCT International Patent Application No. PCT/JP2011/066885, dated Oct. 11, 2011.

(Continued)

*Primary Examiner* — Timor Karimy
(74) *Attorney, Agent, or Firm* — Venable LLP; Michael A. Santon; George L. Howarah

(57) ABSTRACT

In a vertical semiconductor device including a channel in an opening, a semiconductor device whose high-frequency characteristics can be improved and a method for producing the semiconductor device are provided. The semiconductor device includes n-type GaN-based drift layer 4/p-type GaN-based barrier layer 6/n-type GaN-based contact layer 7. An opening 28 extends from a top layer and reaches the n-type GaN-based drift layer. The semiconductor device includes a regrown layer 27 located so as to cover the opening, the regrown layer 27 including an electron drift layer 22 and an electron supply layer 26, a source electrode S, a drain electrode D, and a gate electrode G located on the regrown layer. Assuming that the source electrode serving as one electrode and the drain electrode serving as the other electrode constitute a capacitor, the semiconductor device includes a capacitance-decreasing structure that decreases the capacitance of the capacitor.

4 Claims, 9 Drawing Sheets

(56) References Cited

FOREIGN PATENT DOCUMENTS

| | | |
|---|---|---|
| JP | 2001-267567 A | 9/2001 |
| JP | 2002-076326 A | 3/2002 |
| JP | 2002-203967 A | 7/2002 |
| JP | 2004-260140 A | 9/2004 |
| JP | 2006-140368 A | 6/2006 |
| JP | 2006-286942 A | 10/2006 |
| JP | 2006-303084 A | 11/2006 |
| JP | 2007-173675 A | 7/2007 |
| JP | 2010-232355 A | 10/2010 |
| WO | WO-2008/126821 A1 | 10/2008 |
| WO | WO-2009/110229 A1 | 9/2009 |

OTHER PUBLICATIONS

Notification of Reasons for Rejection in Japanese Patent Application No. 2010-250076, dated Aug. 5, 2014.

* cited by examiner

SEMICONDUCTOR DEVICE AND METHOD FOR PRODUCING THE SAME

TECHNICAL FIELD

The present invention relates to a semiconductor device used for high power switching and a method for producing the semiconductor device, and particularly to a semiconductor device that uses a GaN-based semiconductor among nitride-based semiconductors and a method for producing the semiconductor device.

BACKGROUND ART

High reverse breakdown voltage and low on-resistance are required for high-current switching devices. Field effect transistors (FETs) that use a group III nitride-based semiconductor are excellent in terms of, for example, high breakdown voltage and high-temperature operation because of their wide band gap. Vertical transistors that use a GaN-based semiconductor have been particularly receiving attention as transistors for controlling high power. For example, PTL 1 proposes a vertical GaN-based FET whose mobility is increased and whose on-resistance is decreased by forming an opening in a GaN-based semiconductor and forming a regrown layer including a channel of two-dimensional electron gas (2DEG) in a wall surface of the opening. In this vertical GaN-based FET, a structure including a p-type GaN barrier layer and the like is proposed in order to improve the breakdown voltage characteristics and pinch-off characteristics.

CITATION LIST

Patent Literature

PTL 1: Japanese Unexamined Patent Application Publication No. 2006-286942

SUMMARY OF INVENTION

Technical Problem

In the vertical GaN-based FET, low on-resistance and good breakdown voltage characteristics can be achieved.
However, a vertical semiconductor device used as a high-current switching device needs to have not only low on-resistance and good breakdown voltage characteristics but also good high-frequency characteristics.

A drain electrode into which electrons flow from a channel located in the opening and a source electrode located on an epitaxial top layer so as to face the drain electrode occupy a large area for the purpose of achieving low on-resistance. In particular, the source electrode occupies a large area for the purpose of achieving low contact resistance with the epitaxial top layer. As a result, the source electrode and the drain electrode constitute a parallel-plate capacitor, which forms a parasitic capacitance between the source electrode and the drain electrode. This parasitic capacitance decreases the threshold frequency of a power gain or the like, which degrades the high-frequency characteristics.

It is an object of the present invention to provide a vertical semiconductor device having an opening and including a channel in the opening. In the semiconductor device, high-frequency characteristics can be improved. It is another object of the present invention to provide a method for producing the semiconductor device.

Solution to Problem

A semiconductor device of the present invention is a vertical semiconductor device including a GaN-based stacked layer having an opening. In the semiconductor device, the GaN-based stacked layer includes n-type GaN-based drift layer/p-type GaN-based barrier layer/n-type GaN-based contact layer in that order to the top layer side and the opening extends from a top layer and reaches the n-type GaN-based drift layer. The semiconductor device includes a regrown layer located so as to cover the opening, the regrown layer including an electron drift layer and an electron supply layer; a source electrode located around the opening so as to be in contact with the n-type GaN-based contact layer, the regrown layer, and the p-type GaN-based barrier layer; a drain electrode located so as to have the center corresponding to the center of the opening, the drain electrode and the source electrode sandwiching the GaN-based stacked layer; and a gate electrode located on the regrown layer. Assuming that the source electrode serving as one electrode, the drain electrode serving as the other electrode, and a dielectric material disposed therebetween constitute a capacitor, the semiconductor device includes a capacitance-decreasing structure that decreases a capacitance of the capacitor.

In vertical semiconductor devices in which high current flows in a thickness direction, it is difficult to restrict the area of the source electrode or the like to achieve low on-resistance. As a result, in existing semiconductor devices, a source electrode and a drain electrode facing each other and a GaN-based stacked layer disposed therebetween constitute a capacitor having a certain capacitance. This is a parasitic capacitance, which degrades the high-frequency characteristics.

Since the structure according to the present invention is a capacitance-decreasing structure, the parasitic capacitance can be decreased. Consequently, the threshold frequency of a current gain or power gain can be increased.

When the capacitor having a certain capacitance is assumed to be a parallel-plate capacitor, the capacitance C is estimated to be $C=(\varepsilon \cdot S)/d$, where $\varepsilon$ is a dielectric constant of a material disposed between the electrodes, S is the area of the electrodes, and d is the distance between the electrodes. The capacitance-decreasing structure for the capacitance C is (K1) a structure that decreases the dielectric constant $\varepsilon$ or (K2) a structure that decreases the area S of a portion in which the electrodes overlap each other.

In the capacitance-decreasing structure, the GaN-based stacked layer is formed on a conductive GaN-based substrate; the drain electrode is located on the conductive GaN-based substrate; the source electrode and the conductive GaN-based substrate overlap each other when viewed in plan; the n-type GaN-based drift layer is disposed only in a region that includes a bottom portion of the opening; and a region around the n-type GaN-based drift layer is filled with a low dielectric constant material having a dielectric constant lower than that of the n-type GaN-based drift layer.

Thus, the parasitic capacitance is decreased and the high-frequency characteristics can be improved. Note that the dielectric constant $\varepsilon$ is a product $\varepsilon_r \cdot \varepsilon_0$ of a relative dielectric constant $\varepsilon_r$ that represents the ratio relative to the vacuum and a dielectric constant $\varepsilon_0$ of the vacuum. In the comparison of dielectric constants of materials, the description can be sufficiently made with a relative dielectric constant. In the following description, a dielectric constant indicates a relative dielectric constant unless otherwise specified.

The low dielectric constant material is at least one of air, an insulating layer, an undoped GaN-based semiconductor, and a GaN-based wide gap semiconductor having a band gap larger than that of the n-type GaN-based drift layer.

By replacing the GaN-based drift layer having a relative dielectric constant of about 9.5 with air (relative dielectric constant: about 1), $SiO_2$ (relative dielectric constant: 3.5 to 4.0), or the like, the capacitance can be decreased.

In a capacitance-decreasing structure different from the above-described capacitance-decreasing structure, the GaN-based stacked layer is formed on a high-resistance (insulating) GaN-based substrate; and the drain electrode is located in the high-resistance GaN-based substrate so as to be disposed only in a region that includes a portion corresponding to a bottom portion of the opening when viewed in plan, the drain electrode being in contact with the n-type GaN-based drift layer.

In this structure, the source electrode serving as one electrode is located around the opening and the drain electrode serving as the other electrode is located in the high-resistance GaN-based substrate so as to be disposed only in a region that includes a portion corresponding to a bottom portion of the opening. In this arrangement, the electrodes of a parallel-plate capacitor do not overlap each other when viewed in plan. Therefore, the capacitance is considerably decreased but is not decreased to zero, and the high-frequency characteristics can be improved.

The drain electrode located only in the high-resistance GaN-based substrate is located so as to have a portion exposed in a bottom surface of the high-resistance GaN-based substrate or is located so as not to have a portion exposed in a bottom surface of the high-resistance GaN-based substrate.

In the case of the drain electrode having a portion exposed in the bottom surface of the substrate, an external wiring line can be conductively connected from the bottom surface side of the high-resistance GaN-based substrate to achieve compact wiring in the semiconductor device. In the case of the drain electrode not having a portion exposed in the bottom surface of the substrate, an external wiring line is connected from the GaN-based stacked layer side, but this structure is sometimes favorable in accordance with the application.

A method for producing a semiconductor device according to the present invention is a method for producing a vertical semiconductor device including a GaN-based stacked layer having an opening. The production method includes a step of forming a GaN-based stacked layer including n-type GaN-based drift layer/p-type GaN-based barrier layer/n-type GaN-based contact layer on a conductive GaN-based substrate in that order; a step of forming an opening that extends from the n-type GaN-based contact layer and reaches the n-type GaN-based drift layer; a step of forming a regrown layer so as to cover the opening, the regrown layer including an electron drift layer and an electron supply layer; and a step of forming a source electrode around the opening so as to be in contact with the n-type GaN-based contact layer, the regrown layer, and the p-type GaN-based barrier layer. In the step of forming the n-type GaN-based drift layer of the GaN-based stacked layer, the n-type GaN-based drift layer is formed only in a region that includes a bottom portion of the opening to be formed; and a layer composed of a material having a dielectric constant lower than that of the n-type GaN-based drift layer is formed around the n-type GaN-based drift layer.

According to this method, a semiconductor device whose parasitic capacitance is decreased can be easily produced using existing production equipment.

In the step of forming the n-type GaN-based drift layer, an insulating layer is formed; then, an opening is formed in the insulating layer in the region that includes the bottom portion of the opening to be formed; and the n-type GaN-based drift layer is selectively grown in the opening of the insulating layer.

According to this method, a semiconductor device having a low parasitic capacitance can be easily produced using an existing method. In other words, a semiconductor device whose parasitic capacitance is decreased can be easily produced by forming the n-type GaN-based drift layer in a region below the opening through which electrons flow while forming the insulating layer composed of $SiO_2$ or the like having a low dielectric constant around the n-type GaN-based drift layer.

In the step of forming the n-type GaN-based drift layer, (1) an i-type GaN-based semiconductor layer is formed and then an n-type impurity is implanted into the region that includes the bottom portion of the opening to be formed or (2) an n-type GaN-based semiconductor layer is formed and then a p-type impurity is implanted into a region surrounding the region that includes the bottom portion of the opening to be formed so that an n-type impurity in the n-type GaN-based semiconductor layer is canceled.

According to this method, a semiconductor device having a low parasitic capacitance can be easily produced.

In the step of forming the n-type GaN-based drift layer, either (1) an n-type GaN-based semiconductor layer is formed; then, a resist pattern that masks the region that includes the bottom portion of the opening to be formed and has a hole in the other region is formed; a portion of the n-type GaN-based semiconductor layer below the hole of the resist pattern is removed by etching; and then a GaN-based semiconductor layer having a band gap larger than that of the n-type GaN-based drift layer or an i-type GaN-based semiconductor layer is formed in a region obtained by the removal or (2) a GaN-based semiconductor layer having a band gap larger than that of the n-type GaN-based drift layer or an i-type GaN-based semiconductor layer is formed; then, a resist pattern that masks a region other than the region that includes the bottom portion of the opening to be formed and has a hole in the region that includes the bottom portion of the opening to be formed is formed; a portion of the GaN-based semiconductor layer having a large band gap or i-type GaN-based semiconductor layer below the hole of the resist pattern is removed by etching; and then the n-type GaN-based drift layer is formed in a region obtained by the removal.

According to this method, a semiconductor device having a low parasitic capacitance can be relatively easily produced.

In the step of forming the n-type GaN-based drift layer, an insulating layer is formed, then an opening of the insulating layer is formed in the region that includes the bottom portion of the opening to be formed, and the n-type GaN-based drift layer is selectively grown in the opening of the insulating layer. Subsequently, the regrown layer is formed and an insulating protective layer is formed on the regrown layer; then, a trench for exposing the insulating layer is formed from a bottom surface of the conductive GaN-based substrate or the insulating protective layer; and the insulating layer is removed by wet etching through the trench and a region obtained by the removal is filled with air.

According to this method, a semiconductor device in which an air layer having a low relative dielectric constant (about 1) is disposed around the n-type GaN-based drift layer can be easily produced.

In another method for producing a semiconductor device according to the present invention, a vertical semiconductor device including a GaN-based stacked layer having an opening is produced. The production method includes a step of preparing a high-resistance GaN-based substrate on which a drain electrode is formed in a limited region; a step of forming a GaN-based stacked layer including n-type GaN-based drift layer/p-type GaN-based barrier layer/n-type GaN-based contact layer on the high-resistance GaN-based substrate in that order; a step of forming an opening that extends from the n-type GaN-based contact layer and reaches the n-type GaN-based drift layer; a step of forming a regrown layer so as to cover the opening, the regrown layer including an electron drift layer and an electron supply layer; and a step of forming a source electrode around the opening so as to be in contact with the n-type GaN-based contact layer, the regrown layer, and the p-type GaN-based barrier layer. The region of the drain electrode is limited to a region that includes a portion corresponding to a bottom portion of the opening when viewed in plan.

According to this method, a semiconductor device in which the source electrode and drain electrode which are both conductive portions do not overlap each other or overlap each other in an extremely small area when viewed in plan can be relatively easily produced.

Advantageous Effects of Invention

According to the present invention, in a vertical semiconductor device having an opening and including a channel in the opening, the parasitic capacitance is decreased and thus the high-frequency characteristics can be improved.

DESCRIPTION OF EMBODIMENTS (First Embodiment)

Figure 1:
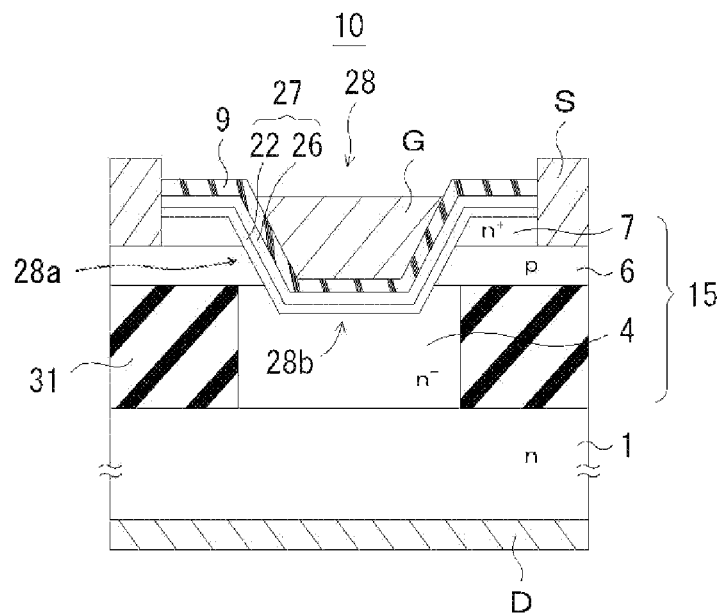
FIG. 1 is a sectional view showing a vertical GaN-based FET (semiconductor device) according to a first embodiment of the present invention (a sectional view taken along line I-I of FIG. 3).

FIG. 1 is a sectional view of a vertical GaN-based FET (semiconductor device) 10 according to a first embodiment of the present invention. The vertical GaN-based FET 10 includes a conductive GaN substrate 1 and n$^-$-type GaN drift layer 4/p-type GaN barrier layer 6/n$^+$-type GaN contact layer 7 epitaxially grown on the GaN substrate 1. Herein, the n$^-$-type GaN drift layer 4 is used as an n-type GaN-based drift layer, the p-type GaN barrier layer 6 is used as a p-type GaN-based barrier layer, and the n$^+$-type GaN contact layer 7 is used as an n-type GaN-based contact layer. The n$^-$-type GaN drift layer 4 is not formed in the entire region and is formed substantially only in a region corresponding to an opening 28 when viewed in plan. A region outside the n$^-$-type GaN drift layer 4 is filled with an insulating layer 31 having a dielectric constant ∈ lower than that of the n$^-$-type GaN drift layer 4. The insulating layer 31 is disposed between the conductive GaN substrate 1 and the p-type GaN barrier layer 6 and outside the n$^-$-type GaN drift layer 4 located so as to have the center corresponding to the center of a bottom portion 28b of the opening. The insulating layer 31 may be any layer whose dielectric constant is lower than that of the n$^-$-type GaN drift layer 4.

The insulating layer 31 can be composed of, for example, silicon oxide ($SiO_2$). The relative dielectric constant of a semiconductor GaN is 9.5 whereas the relative dielectric constant (1 MHz) of silicon oxide ($SiO_2$) is 3.8. The capacitance of a capacitor constituted by two electrodes which are a source electrode S and a drain electrode D is substantially reduced by half. As a result, the high-frequency characteristics are improved.

The n$^-$-type GaN drift layer 4 confined by the insulating layer 31/p-type GaN barrier layer 6/n$^+$-type GaN contact layer 7 constitutes a GaN-based stacked layer 15. A buffer layer composed of an AlGaN layer or GaN layer may be inserted between the GaN substrate 1 and the n⁻-type GaN drift layer 4 depending on the type of the GaN substrate 1.

The GaN substrate 1 may be a so-called monolithic, thick GaN substrate or a substrate including a GaN layer that is in ohmic contact with a support substrate as long as the GaN substrate 1 has electrical conductivity. In addition, by forming a GaN layer on a GaN substrate or the like during the growth of a GaN-based stacked layer and then removing a portion having a certain thickness corresponding to the thickness of the GaN substrate or the like, only a thin GaN layer may be left as a base in the form of products. The GaN substrate, the substrate including a GaN layer that is in ohmic contact with a support substrate, and the thin GaN layer left as a base in the form of products may be simply referred to as a GaN substrate. In a fourth embodiment, an insulating substrate is described. Although there is a difference in that the GaN substrate is a conductive substrate or an insulating substrate, other forms of the insulating substrate are the same as those of the above-described conductive substrate.

In the case of the conductive thin GaN layer left as a base, a drain electrode can be disposed on the top or bottom surface of the thin GaN layer depending on the production process and the structure of products. In this embodiment, in the case where the GaN substrate, the support substrate, or the like is left in a product, the support substrate or the substrate is a conductive substrate. When the support substrate or the substrate is a conductive substrate, the drain electrode can be disposed directly on the bottom (lower) surface or top (upper) surface of the support substrate or the substrate.

In this embodiment, the p-type GaN barrier layer 6 is used as the p-type GaN-based barrier layer, but a p-type AlGaN layer may be used. Regarding other layers constituting the stacked layer 15, other GaN-based semiconductor layers may be used instead of the GaN layers, if necessary.

In the GaN-based stacked layer 15, an opening 28 is formed so as to penetrate from the n⁺-type GaN contact layer 7 to the p-type GaN barrier layer 6 and reach the n⁻-type GaN drift layer 4. The opening 28 is defined by a wall surface (side surface) 28a and a bottom portion 28b. A regrown layer 27 is epitaxially grown so as to cover the wall surface 28a and bottom portion 28b of the opening 28 and the top layer (n⁺-type GaN contact layer 7) of the GaN-based stacked layer 15. The regrown layer 27 is constituted by an intrinsic GaN (i-type GaN) electron drift layer 22 and an AlGaN electron supply layer 26. An intermediate layer composed of AlN or the like may be inserted between the i-type GaN electron drift layer 22 and the AlGaN electron supply layer 26. A source electrode S is located on the GaN-based stacked layer 15 so as to be electrically connected to the regrown layer 27, the n⁺-type GaN contact layer 7, and the p-type GaN barrier layer 6. In FIG. 1, the source electrode S extends downwards and has a side surface that is in contact with the end face of the regrown layer 27 and the n⁺-type GaN contact layer 7 and an end portion that is in contact with the p-type GaN barrier layer 6. Thus, an electrical connection is established. A drain electrode D is located on the bottom surface of the conductive GaN substrate 1.

The p-type GaN barrier layer 6 needs to be disposed to improve the breakdown voltage characteristics in the off-state and the pinch-off characteristics. In particular, when the p-type GaN barrier layer 6 is electrically connected to the source electrode S, the p-type GaN barrier layer 6 stably improves the breakdown voltage characteristics in the off-state and the pinch-off characteristics. Another advantage provided by electrically connecting the p-type GaN barrier layer 6 to the source electrode S is that holes generated in a depletion layer of a pn junction between the p-type GaN barrier layer 6 and the n⁻-type drift layer 4 under the application of reverse bias voltage can be absorbed. This prevents the decrease in breakdown voltage caused when holes are left, which can stably produce good breakdown voltage characteristics for a long time.

An insulating layer 9 is located below a gate electrode G so as to cover the regrown layer 27. The insulating layer 9 is disposed in order to reduce a gate leak current generated when positive voltage is applied to the gate electrode, which allows high-current operation. Since the threshold voltage can be further shifted in a positive direction, normally-off is easily achieved. Note that the insulating layer 9 is not necessarily disposed.

In the on-state, in the regrown layer 27, two-dimensional electron gas (2DEG) is generated in the i-type GaN electron drift layer 22 at a position near the interface between the i-type GaN electron drift layer 22 and the AlGaN electron supply layer 26. Such two-dimensional electron gas is generated in the i-type GaN electron drift layer 22 at a position near the interface between the i-type GaN electron drift layer 22 and the AlGaN layer due to, for example, spontaneous polarization or piezoelectric polarization caused by difference in lattice constant. Electrons flow from the source electrode S to the drain electrode D through the two-dimensional electron gas and the n⁻-type GaN drift layer 4. Since the i-type GaN electron drift layer 22 and the AlGaN electron supply layer 26 in the regrown layer 27 are successively grown in the same growth chamber, the density of impurity level or the like at the interface can be reduced to a low value. Therefore, a high current (per unit area) can be caused to flow with low on-resistance while having a structure in which a high current is caused to flow in a thickness direction by forming the opening 28.

As described above, in existing vertical semiconductor devices, a parasitic capacitance is formed between the source electrode S and the drain electrode D or conductive GaN substrate 1, which degrades the high-frequency characteristics. High-frequency characteristics are determined by, for example, the threshold frequency (power gain cutoff frequency) $f_{max}$ at which the power gain Gu is not obtained and/or the threshold frequency (current gain cutoff frequency) fT at which the current gain $|h_{21}|^2$ is not obtained. As the power gain cutoff frequency $f_{max}$ or the current gain cutoff frequency fT increases, the high-frequency characteristics improve.

By locating the n⁻-type GaN drift layer 4 so as to have the center corresponding to the center of the opening 28 and include the bottom portion 28b, the flow of electrons reaches the conductive GaN substrate 1/drain electrode D through the n⁻-type GaN drift layer 4 in the on-state without being blocked by the insulating layer 31. The insulating layer 31 having a dielectric constant lower than that of the n⁻-type GaN drift layer 4 is disposed outside the n⁻-type GaN drift layer 4 and between the conductive GaN substrate 1 and the p-type GaN barrier layer 6. Therefore, the parasitic capacitance decreases and thus the high-frequency characteristics can be improved.

The n-type impurity concentration of the n⁻-type GaN drift layer 4 may be, for example, $1×10^{15}$ (1E15) cm⁻³ or more and $1×10^{17}$ (1E17) cm⁻³ or less. The thickness of the n⁻-type GaN drift layer 4 may be, for example, 1.0 μm or more and 10.0 μm or less.

The p-type impurity concentration of the p-type GaN barrier layer 6 may be about $1×10^{17}$ (1E17) cm⁻³ to $1×10^{19}$ (1E19) cm⁻³. The p-type impurity may be an impurity, such as Mg, that forms an acceptor in a GaN-based semiconductor. The thickness of the p-type GaN barrier layer 6 is dependent on, for example, the thickness of the n⁻-type GaN drift layer, and thus the range of the thickness cannot be determined in a general manner. However, the typical thickness often used in many devices is about 0.3 µm to 1 µm. If the thickness is less than 0.3 µm, breakdown voltage characteristics and pinch-off characteristics cannot be sufficiently produced and thus 0.3 µm may be set as the lower limit of the thickness. If the p-type GaN barrier layer 6 having a thickness of about 0.3 µm to 1 µm has an excessively high Mg content, straight movement toward the end face of the p-type GaN barrier layer 6 occurs, which adversely affects the channel (increases the on-resistance). The reverse voltage characteristics (breakdown voltage characteristics) at a pn junction between the p-type GaN barrier layer 6 and the n⁻-type GaN drift layer during channel interruption are also degraded.

The n-type impurity concentration of the n⁺-type GaN contact layer 7 may be about $5×10^{17}$ (5E17) cm$^{-3}$ to $5×10^{19}$ (5E19) cm$^{-3}$. The thickness of the n⁺-type GaN contact layer 7 may be about 0.1 µm to 0.6 µm. The length of the n⁺-type GaN contact layer 7 may be 0.5 µm or more and 5 µm or less.

Figure 2:
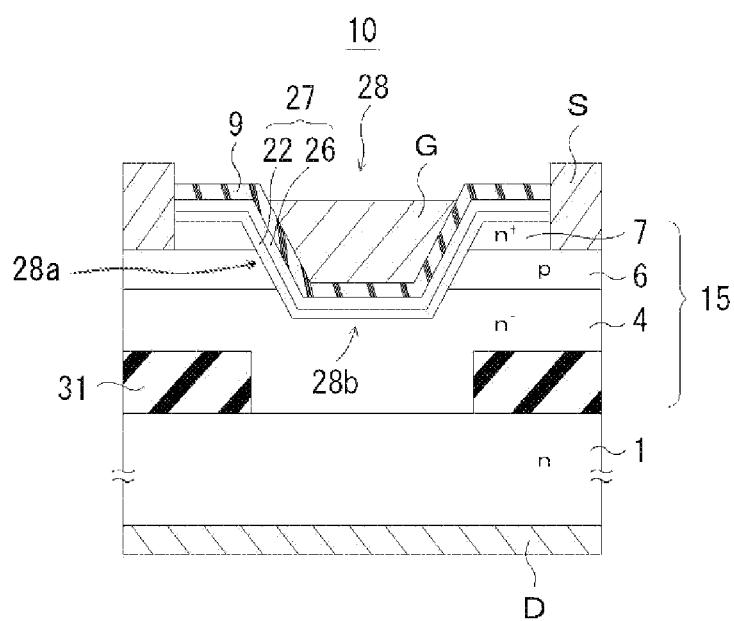
FIG. 2 is a sectional view of a semiconductor device, which is a modification of the vertical GaN-based FET in FIG. 1.

As shown in FIG. 2, the insulating layer 31 does not necessarily have the same thickness as the n⁻-type GaN drift layer 4 and may have a thickness which is several tens of percent of the thickness of the n⁻-type GaN drift layer 4. As long as a dielectric (insulating layer 31) having a low dielectric constant is employed, the capacitance decreases regardless of the ratio of the thickness of the dielectric between electrodes relative to the entire thickness. As a matter of production, the n⁻-type GaN drift layer 4 may be disposed widely on the bottom portion 28b side of the opening 28 as shown in FIG. 2. That is, the insulating layer 31 may be disposed on the substrate 1 side. Note that the insulating layer 31 may be disposed so as to be in contact with the p-type GaN barrier layer 6.

Figure 3:
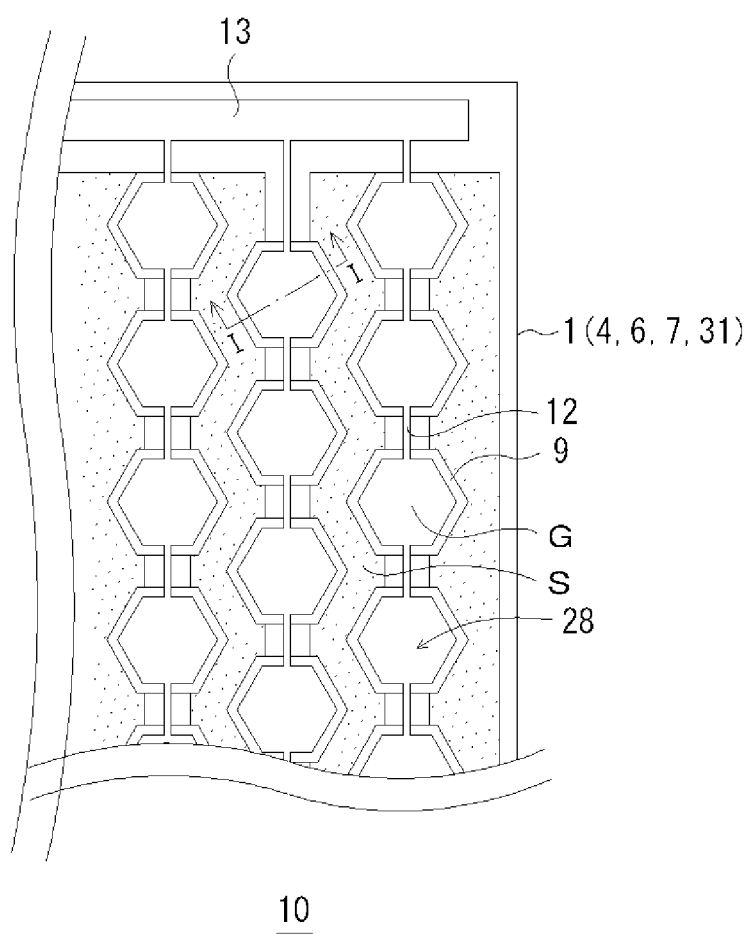
FIG. 3 is a plan view of the vertical GaN-based FET in FIG. 1.

FIG. 3 is a plan view of the vertical GaN-based semiconductor device 10 shown in FIG. 1, and FIG. 1 is a sectional view taken along line I-I of FIG. 3. Referring to FIG. 3, the opening 28 has a hexagonal shape and a region around the opening 28 is substantially covered with the source electrode S while the source electrode S does not overlap a gate wiring line 12. Consequently, a closest-packed structure (honeycomb structure) is formed and thus the gate electrode has a long perimeter per unit area. By employing such a shape, the on-resistance can also be decreased. The importance of the parasitic capacitance that is formed by two electrodes which are the source electrode S and the drain electrode D or conductive GaN substrate and that has been repeatedly described is obvious from the fact that the source electrode S has a large area as shown in the plan view.

An electric current flows from the source electrode S and enters a channel (electron drift layer 22) in the regrown layer 27 directly or through the n⁺-type GaN contact layer 7. Then, the electric current flows to the drain electrode D through the GaN drift layer 4. In order to prevent the source electrode S and the wiring line thereof from interfering with a gate structure including the gate electrode G, the gate wiring line 12, and a gate pad 13, the source wiring line is disposed on an interlayer-insulating layer (not shown). A via hole is formed in the interlayer-insulating layer, and the source electrode S including a conductive portion obtained by filling the via hole is conductively connected to a source conductive layer (not shown) on the interlayer-insulating layer. As a result, a source structure including the source electrode S can have low electrical resistance and high mobility, which are suitable for high-power devices.

Figure 4:
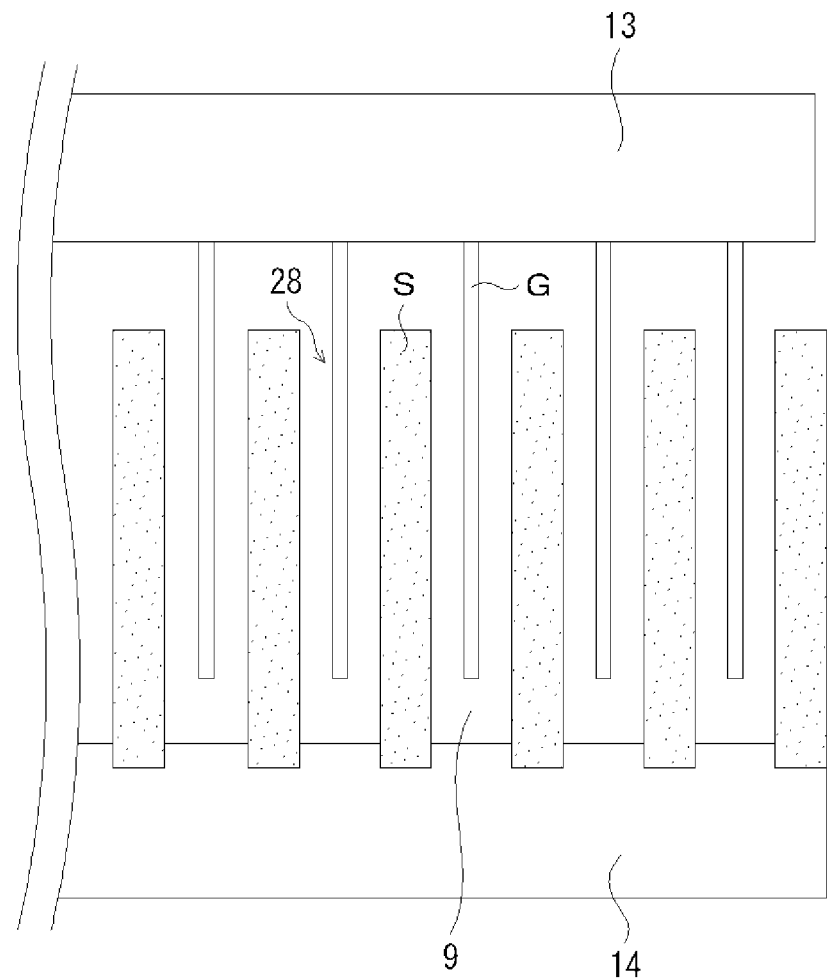
FIG. 4 is a plan view showing a vertical GaN-based FET which is different from the vertical GaN-based FET in FIG. 3 but has the same sectional view as that in FIG. 1.

FIG. 4 is a plan view showing the arrangement of openings and the electrode structure of a vertical GaN-based FET of the present invention. The vertical GaN-based FET has the same sectional structure as that shown in FIG. 1, but has a planar structure different from that shown in FIG. 3. The vertical GaN-based FET having the electrode structure or the like shown in FIG. 4 is also a semiconductor device according to an embodiment of the present invention. The perimeter of openings per unit area can also be increased by densely arranging elongated rectangular openings 28. Consequently, the current density can be improved. In this case, the gate electrode G and the source electrode S each extend toward its counterpart so as to be orthogonal to the gate pad 13 and a source pad 14 arranged in parallel in a longitudinal direction. Thus, the gate electrode G and the source electrode S form an interdigital structure. In high-frequency vertical GaN-based FETs, the configuration in which the gate electrode G and the source electrode S form an interdigital structure as shown in FIG. 4 is commonly employed.

Figure 5A:
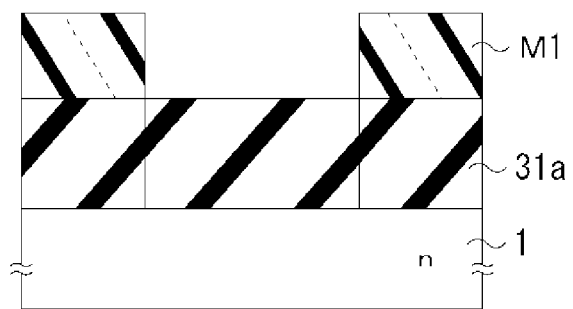
FIG. 5A is a diagram showing a method for producing the vertical GaN-based FET in FIG. 1, the diagram showing the state in which an insulating layer having a dielectric constant lower than that of an n$^-$-type GaN drift layer has been formed on a support substrate and then a resist pattern has been formed.
Figure 5B:
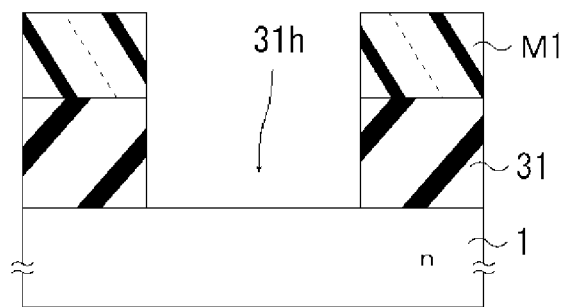
FIG. 5B is a diagram showing a method for producing the vertical GaN-based FET in FIG. 1, the diagram showing the state in which, after the state shown in FIG. 5A, the insulating layer has been etched using the resist pattern as a mask to form an opening.
Figure 5C:
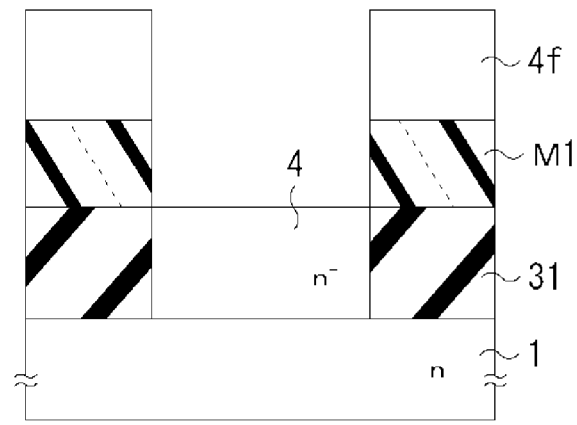
FIG. 5C is a diagram showing a method for producing the vertical GaN-based FET in FIG. 1, the diagram showing the state in which, after the state shown in FIG. 5B, an n$^-$-type GaN drift layer has been epitaxially grown in the opening.
Figure 5D:
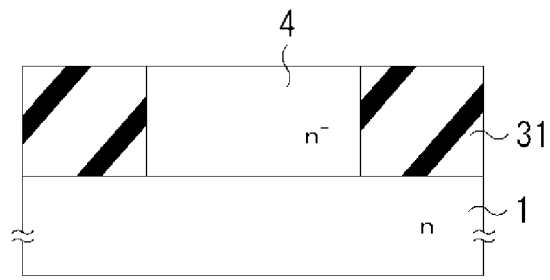
FIG. 5D is a diagram showing a method for producing the vertical GaN-based FET in FIG. 1, the diagram showing the state in which, after the state shown in FIG. 5C, lift-off has been performed by removing the resist pattern.

A method for producing the semiconductor device 10 according to this embodiment will be described. As shown in FIG. 5A, an insulating layer 31a having a dielectric constant lower than that of an n⁻-type GaN drift layer 4 is formed on a conductive GaN substrate 1. A resist pattern M1 is formed and then an opening 31h of the insulating layer is formed by wet etching in a region in which the n⁻-type GaN drift layer 4 is to be formed (FIG. 5B). The opening 31h of the insulating layer may have a size that includes a bottom portion 28b of an opening 28 to be formed. Subsequently, as shown in FIG. 5C, the n⁻-type GaN drift layer 4 is grown on the conductive GaN substrate and in the opening 31h of the insulating layer using the resist pattern M1. During the growth, an n⁻-type GaN deposit layer 4f is also formed on the resist pattern M1. The n⁻-type GaN deposit layer 4f is subjected to lift-off when the resist pattern M1 is removed.

Figure 6:
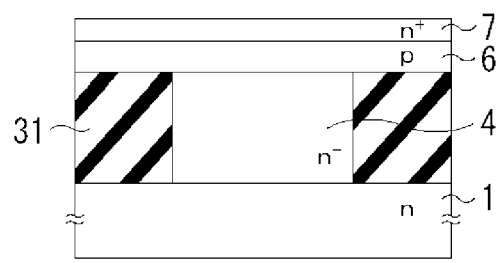
FIG. 6 is a diagram showing the state in which a p-type GaN barrier layer and an n$^+$-type GaN contact layer have been formed.

As shown in FIG. 6, a p-type GaN barrier layer 6 is then formed under the conditions (e.g., growth rate) under which epitaxial growth occurs on the n⁻-type GaN drift layer 4 and also spreads to the area above the insulating layer 31. Subsequently, an n⁺-type GaN contact layer 7 is grown to complete a stacked layer 15. As described above, a GaN-based buffer layer (not shown) may be inserted between the GaN substrate 1 and the n⁻-type GaN drift layer 4.

The formation of the above layers may be performed by, for example, metal-organic chemical vapor deposition (MOCVD). By performing growth using MOCVD, a stacked layer 15 having good crystallinity can be formed. In the case where the GaN substrate 1 is formed by growing a gallium nitride film on a conductive substrate using MOCVD, trimethylgallium is used as a gallium raw material. High-purity ammonia is used as a nitrogen raw material. Purified hydrogen is used as a carrier gas. The purity of the high-purity ammonia is 99.999% or more and the purity of the purified hydrogen is 99.999995% or more. A hydrogen-based silane may be used as a Si raw material for an n-type dopant (donor) and cyclopentadienyl magnesium may be used as a Mg raw material for a p-type dopant (acceptor).

A conductive gallium nitride substrate having a diameter of two inches is used as the conductive substrate. The substrate is cleaned at 1030° C. at 100 Torr in an atmosphere of ammonia and hydrogen. Subsequently, the temperature is increased to 1050° C. and a gallium nitride layer is grown at 200 Torr at a VIII ratio of 1500, which is the ratio of the nitrogen raw material and gallium raw material.

Figure 7:
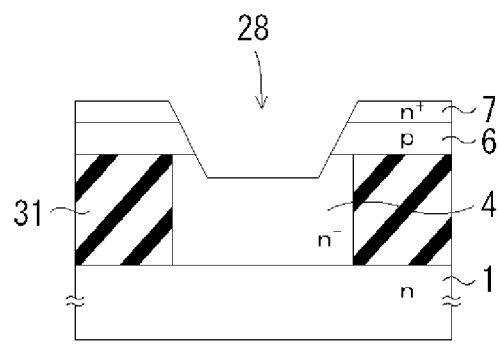
FIG. 7 is a diagram showing the state in which an opening has been formed by etching.
Figure 8A:
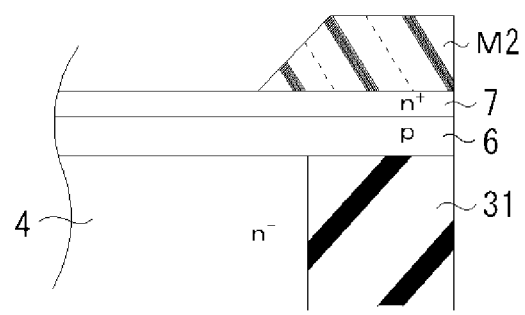
FIG. 8A is a diagram showing the state in which, at the stage of forming an opening by RIE, a resist pattern has been formed.
Figure 8B:
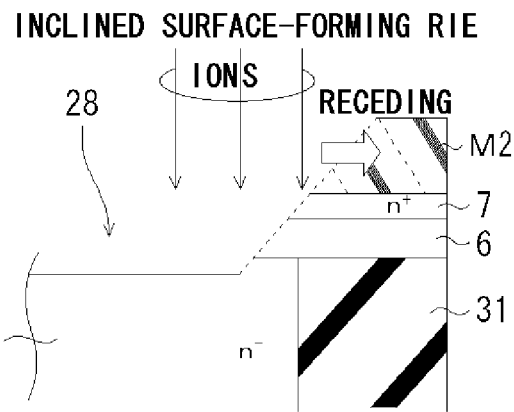
FIG. 8B is a diagram showing the state in which, at the stage of forming an opening by RIE, after the state shown in FIG. 8A, a stacked layer is etched down by performing ion irradiation and the opening is expanded (caused to recede).

Subsequently, as shown in FIG. 7, an opening 28 is formed by reactive ion etching (RIE). As shown in FIGS. 8A and 8B, a resist pattern M2 is formed on the top of epitaxial layers 4, 6, and 7. The resist pattern M2 is then etched by RIE to cause the resist pattern M2 to recede, whereby an opening is expanded to form an opening 28. In this RIE process, the inclined surface of the opening 28, that is, the end face of the stacked layer 15 is damaged by being subjected to ion irradiation. In the damaged portion, for example, a high-density region of dangling bonds and lattice defects is formed. Conductive impurities derived from an RIE equipment or unspecified sources reach the damaged portion and thus enrichment occurs. The formation of the damaged portion results in an increase in drain leak current and thus the restoration needs to be performed. When hydrogen and ammonia are contained at certain levels, the restoration regarding the dangling bonds and the like and the removal and passivation of the impurities can be achieved during the growth of a regrown layer 27 described below.

Figure 9:
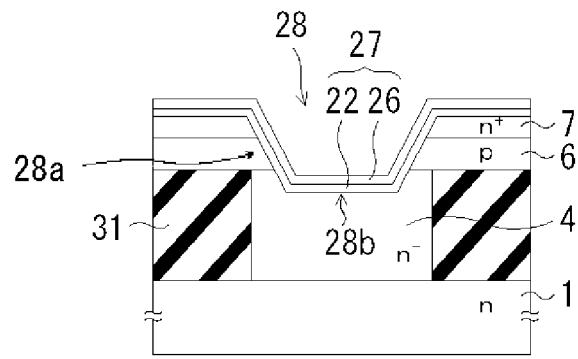
FIG. 9 is a diagram showing the state in which a regrown layer has been formed in the opening.

Subsequently, the resist pattern M2 is removed and the wafer is cleaned. The wafer is inserted into an MOCVD apparatus and a regrown layer 27 including an electron drift layer 22 composed of undoped GaN and an electron supply layer 26 composed of undoped AlGaN is grown as shown in FIG. 9. In the growth of the undoped GaN layer 22 and undoped AlGaN layer 26, thermal cleaning is performed in an atmosphere of ($NH_3+H_2$), and then an organic metal material is supplied while ($NH_3+H_2$) is being introduced. In the thermal cleaning before the formation of the regrown layer 27 or in the formation of the regrown layer 27, the restoration regarding the damaged portion and the removal and passivation of the conductive impurities are allowed to proceed.

Figure 10:
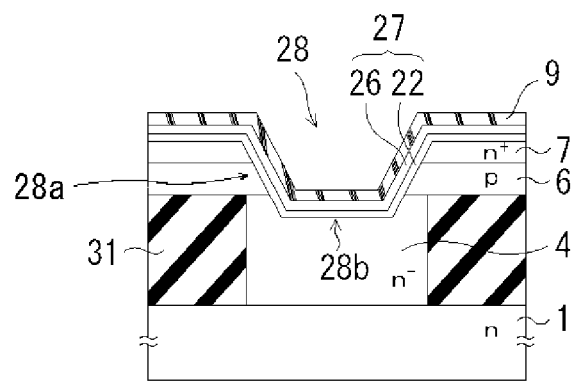
FIG. 10 is a diagram showing the state in which an insulating layer has been grown on the regrown layer.

Subsequently, the wafer is taken out of the MOCVD apparatus and an insulating layer 9 is grown as shown in FIG. 10. A source electrode S and a drain electrode D are then formed on the top surface of the epitaxial layer and the bottom surface of the GaN substrate 1, respectively, by photolithography and electron beam deposition as shown in FIG. 1.

(Second Embodiment)

Figure 11:
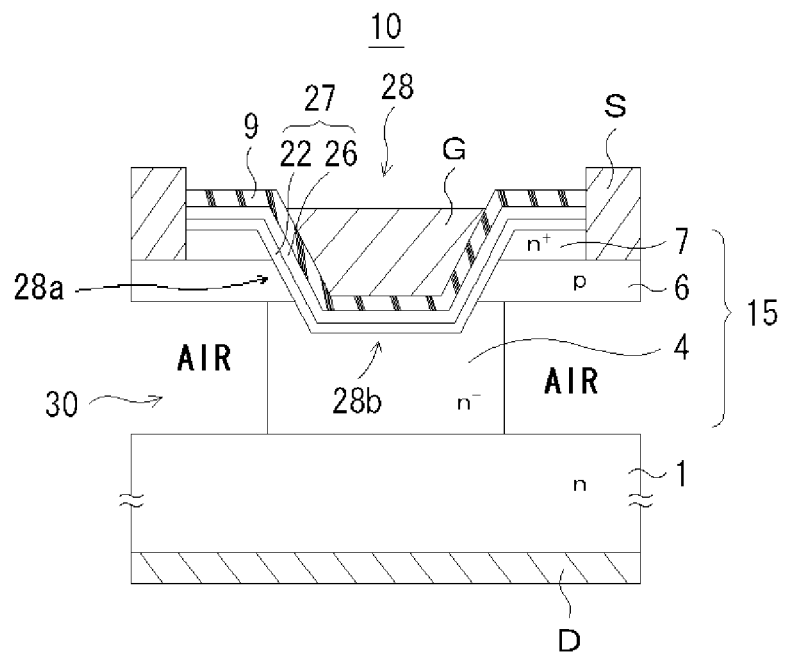
FIG. 11 is a sectional view showing a vertical GaN-based FET (semiconductor device) according to a second embodiment of the present invention.

FIG. 11 is a sectional view showing a vertical GaN-based FET (semiconductor device) 10 according to a second embodiment of the present invention. In this embodiment, the $n^-$-type GaN drift layer 4 is disposed only in a region that includes the bottom portion 28b of the opening 28, and the $n^-$-type GaN drift layer 4 is surrounded by an air layer 30. Air has a dielectric constant slightly higher than that of a vacuum, which means that air has substantially the same dielectric constant as a vacuum. Therefore, the relative dielectric constant is about 1, which is a dielectric constant lower than that of any material. Since the relative dielectric constant of the $n^-$-type GaN drift layer 4 is roughly 10, the parasitic capacitance can be considerably decreased by employing the air layer 30.

It has been described with reference to FIG. 1 that a portion around the $n^-$-type GaN drift layer 4 is replaced with an insulator having a dielectric constant lower than that of the $n^-$-type GaN drift layer 4 over the entire thickness. It has been described with reference to FIG. 2 that a portion around the $n^-$-type GaN drift layer 4 may be replaced with the insulator over a fraction of the entire thickness. Similarly, a portion around the $n^-$-type GaN drift layer 4 in FIG. 11 is not replaced with the air layer 30 over the entire thickness, and the portion around the $n^-$-type GaN drift layer 4 may be replaced with the air layer 30 over a fraction of the entire thickness and the remaining portion may be left as the $n^-$-type GaN drift layer 4.

The semiconductor device according to this embodiment is produced through the following process. By the method for producing a semiconductor device in the first embodiment, an intermediate product shown in FIG. 10 is formed. In the intermediate product shown in FIG. 10, an intermittent trench is formed in the conductive GaN substrate 1 or the insulating layer 9/regrown layer 27/$n^+$-type GaN contact layer 7/p-type GaN barrier layer 6 so that the insulating layer 31 disposed around the $n^-$-type GaN drift layer 4 is exposed. To achieve this, a resist pattern having a hole corresponding to the trench to be formed is formed and then the trench that reaches the insulating layer 31 is formed by dry or wet etching. Subsequently, an etchant is poured through the trench to remove the insulating layer 31 by wet etching using the above-described resist pattern or a newly formed resist pattern. The insulating layer 31 may be left on a wall surface and bottom portion with a predetermined small thickness, without removing the entire layer. A metal layer for closing the trench may be formed in the arrangement or posture in which the trench is covered by being inclined.

(Third Embodiment)

Figure 12:
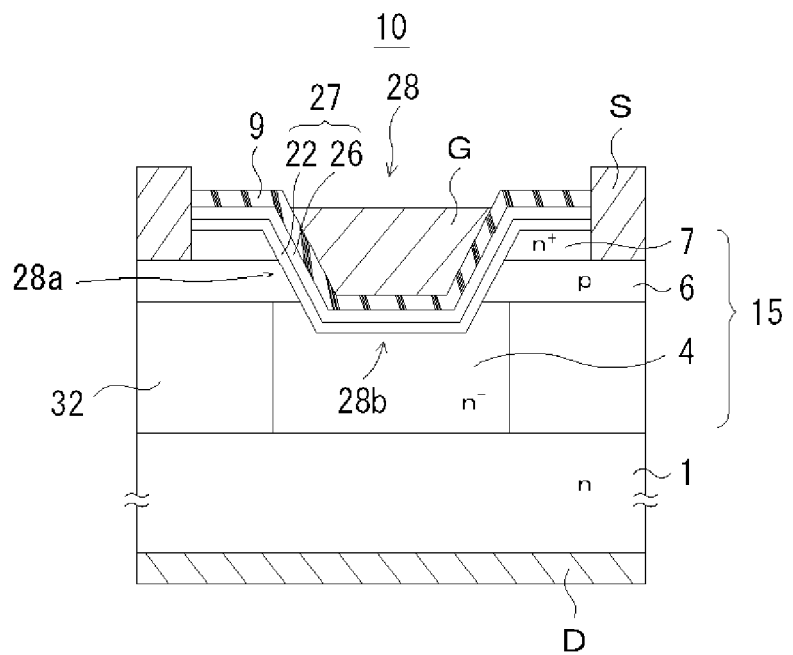
FIG. 12 is a sectional view showing a vertical GaN-based FET (semiconductor device) according to a third embodiment of the present invention.

FIG. 12 is a sectional view showing a vertical GaN-based FET (semiconductor device) 10 according to a third embodiment of the present invention. In this embodiment, the $n^-$-type GaN drift layer 4 is formed only in a region that includes the bottom portion 28b of the opening 28, and an intrinsic semiconductor layer 32 such as an i-type GaN layer that contains no impurities is disposed around the $n^-$-type GaN drift layer 4 over the entire thickness of the $n^-$-type GaN drift layer 4. The n-type impurity concentration decreases and thus the dielectric constant of the intrinsic semiconductor layer 32 decreases. As a result, the parasitic capacitance can be decreased and the high-frequency characteristics can be improved.

The semiconductor layer 32 whose n-type impurity concentration is decreased, such as i-type GaN, may be a GaN-based semiconductor 32 (e.g., AlInGaN) having a band gap larger than that of the $n^-$-type GaN drift layer 4. The GaN-based semiconductor 32 having a band gap larger than that of the $n^-$-type GaN drift layer 4 has a dielectric constant lower than that of the $n^-$-type GaN drift layer 4, like the intrinsic GaN-based semiconductor having a low impurity concentration. By disposing the GaN-based semiconductor 32 having a band gap larger than that of the $n^-$-type GaN drift layer 4 around the $n^-$-type GaN drift layer 4, the parasitic capacitance can be decreased and thus the high-frequency characteristics can be improved. The GaN-based semiconductor 32 having a band gap larger than that of the $n^-$-type GaN drift layer 4 may contain an n-type impurity within the category of an $n^-$-type.

A portion around the $n^-$-type GaN drift layer 4 is not necessarily replaced with the i-type GaN layer 32 having a low n-type impurity concentration or the GaN-based semiconductor 32 having a band gap larger than that of the $n^-$-type GaN drift layer 4 over the entire thickness. As described above, a portion around the $n^-$-type GaN drift layer 4 may be replaced with the i-type GaN layer 32 or the GaN-based semiconductor 32 over a fraction of the entire thickness and the $n^-$-type GaN drift layer 4 may extend in the remaining portion.

(Fourth Embodiment)

Figure 13:
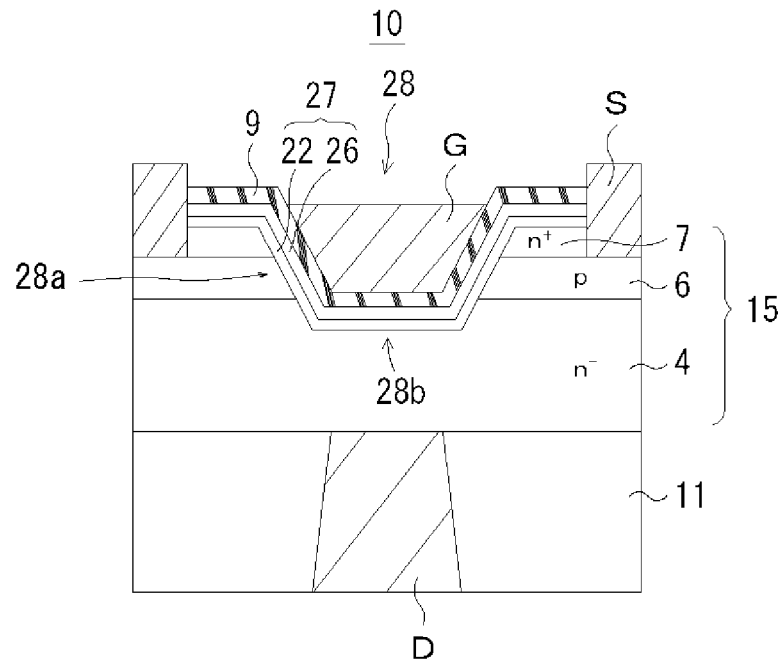
FIG. 13 is a sectional view showing a vertical GaN-based FET (semiconductor device) according to a fourth embodiment of the present invention.

FIG. 13 is a sectional view showing a vertical GaN-based FET (semiconductor device) 10 according to a fourth embodiment of the present invention. The vertical GaN-based FET 10 includes an insulating GaN substrate 11 and $n^-$-type GaN drift layer 4/p-type GaN barrier layer 6/$n^+$-type GaN contact layer 7 epitaxially grown on the insulating GaN substrate 11. In this embodiment, the $n^-$-type GaN drift layer 4 is not necessarily formed only in a region that includes the bottom portion 28b of the opening 28, unlike the semiconductor devices according to the first to third embodiments.

The feature of this embodiment is that the drain electrode D is formed in a high-resistance GaN substrate or insulating substrate 11. In particular, the drain electrode D is formed only in a region that faces the bottom portion 28b of the opening 28 and penetrates through the insulating GaN substrate 11. In this arrangement structure of the drain electrode D, there is no region where the source electrode S overlaps a conductive portion such as the drain electrode D or a conductive substrate when viewed in plan. As a result, a picture of a parallel-plate capacitor does not hold. Thus, the parasitic capacitance is considerably decreased and the high-frequency characteristics are improved.

Since the drain electrode D penetrates through the insulating substrate 11 and is exposed in the bottom surface of the insulating substrate 11, a wiring line can be connected from the bottom surface of the insulating substrate 11. Consequently, a compact wiring structure can be formed.

The insulating GaN-based substrate 11 can be easily obtained by forming the drain electrode D only in a predetermined region of the insulating GaN-based substrate 11 using existing equipment and an existing metal layer-forming method.

Figure 14:
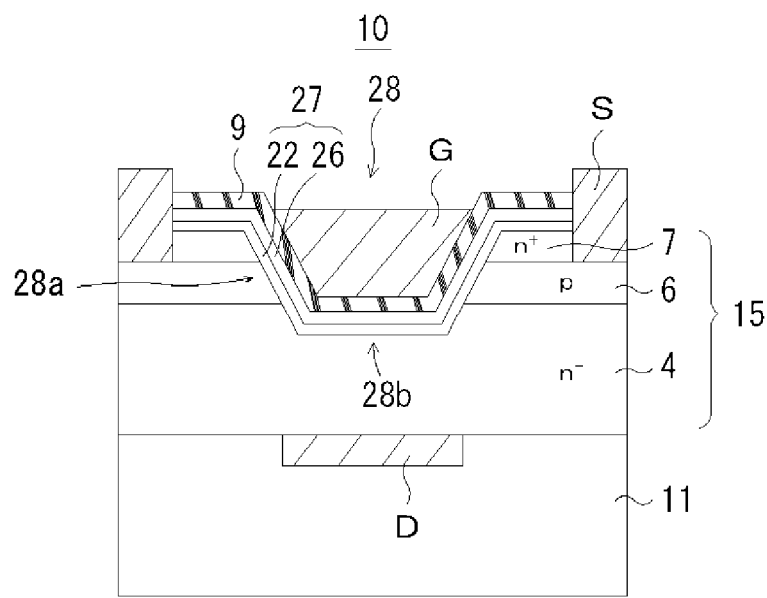
FIG. 14 is a sectional view of a semiconductor device that belongs to the fourth embodiment of the present invention, which is a modification of the semiconductor device in FIG. 13.

FIG. 14 is a modification (modification of the fourth embodiment) of the semiconductor device in FIG. 13, which is one of the embodiments of the present invention. In this modification, the drain electrode D is formed in the high-resistance GaN substrate or insulating substrate 11 and only in a region that faces the bottom portion 28b of the opening 28, which is the same feature as that of the semiconductor device in FIG. 13. Therefore, there is no region where the source electrode S overlaps a conductive portion such as the drain electrode D or a conductive substrate when viewed in plan. Thus, the parasitic capacitance is considerably decreased and the high-frequency characteristics are improved.

However, in this modification, the drain electrode D is in contact with the GaN-based stacked layer 15, but is not exposed in the bottom surface of the insulating GaN substrate 11. Therefore, a wiring line connected to the drain electrode D needs to be accessed from the GaN-based stacked layer 15 side.

EXAMPLES

Regarding the semiconductor device shown in FIG. 2 according to the first embodiment, the simulation of an S (RF) parameter was performed by changing the thickness of the insulating layer 31. The semiconductor device 10 had the following structure.

n⁻-type GaN drift layer 4: the thickness of an n⁻-type GaN drift layer that included the bottom portion 28b of the opening 28 was 5 µm and all test specimens had the same n-type impurity concentration of $1\times10^{16}$ (1E16) cm³.

The insulating layer 31 disposed around the n⁻-type GaN drift layer 4 was composed of $SiO_2$ (relative dielectric constant 3.8). The insulating layer 31 was disposed only on the lower side (substrate side) of the n⁻-type GaN drift layer 4 in a thickness direction, and the n⁻-type GaN drift layer 4 was disposed on the upper side (opening side) (refer to FIG. 2). The thickness of the insulating layer 31 was changed in the range from zero (existing semiconductor device) to 3.5 µm. The case of a thickness of 3.5 µm corresponds to the case where 70% of the entire thickness of the n⁻-type GaN drift layer 4 is replaced with $SiO_2$.

The dependence of the power gain (Gu) and current gain ($|h_{21}|^2$) on frequency was determined by computer simulation to determine the cutoff frequency at which the power gain and the current gain are 1.

Figure 15:
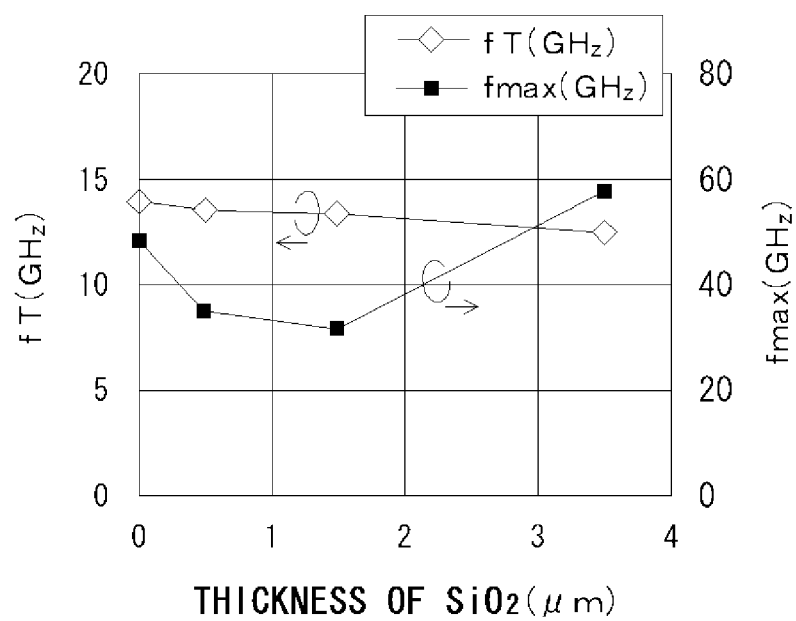
FIG. 15 is a diagram showing an effect of varied thicknesses of a silicon oxide layer on the power gain cutoff frequency and current gain cutoff frequency, the silicon oxide layer being disposed around a limited region of an n$^-$-type GaN drift layer in Examples.

FIG. 15 shows the results. Referring to FIG. 15, the current gain cutoff frequency fT shows almost no change or tends to slightly decrease as the thickness of the insulating layer 31 increases. However, the power gain cutoff frequency $f_{max}$ has a minimum value at a thickness of silicon oxide of 1.5 µM and increases in the range in which the thickness of the silicon oxide is larger than 1.5 µm.

When the thickness of the silicon oxide is 3.5 µm, the power gain cutoff frequency $f_{max}$ has a maximum value.

In Examples, examination is made only up to the case where the thickness of the silicon oxide is 70% of the entire thickness of the n⁻-type GaN drift layer 4. It is believed that, by further increasing the ratio of the silicon oxide, the power gain cutoff frequency $f_{max}$ is further increased and the current gain cutoff frequency fT also has a value that is in balance with the power gain cutoff frequency $f_{max}$. Although the control in production is difficult, a higher power gain cutoff frequency $f_{max}$ can be obtained by further increasing the thickness of the insulating layer 31 in FIG. 2, for example, to the thickness of the n⁻-type GaN drift layer 4 as shown in FIG. 1.

The structures disclosed in the above embodiments of the present invention are mere examples and the scope of the present invention is not limited to these embodiments. The scope of the present invention is defined by the appended claims, and all changes that fall within the scope of the claims and the equivalence thereof are therefore embraced by the claims.

Industrial Applicability

According to the semiconductor device or the like of the present invention, in a vertical semiconductor device having an opening, by forming an insulating layer or semiconductor having a lower dielectric constant between the source electrode and the drain electrode or conductive substrate and around the n⁻-type GaN drift layer located in the bottom portion of the opening, the parasitic capacitance can be decreased and the high-frequency characteristics can be improved. In another structure, by disposing the drain electrode in the insulating substrate only in a region that faces the bottom portion of the opening, the parasitic capacitance can be decreased and the high-frequency characteristics can be improved.

Reference Signs List

1 GaN substrate
4 n⁻-type GaN drift layer
4f n⁻-type GaN deposit layer
6 p-type GaN barrier layer
7 n⁺-type GaN contact layer
9 insulating layer
10 semiconductor device (vertical GaN-based FET)
11 insulating (high-resistance) substrate
12 gate wiring line
13 gate pad
14 source pad
15 GaN-based stacked layer
22 GaN electron drift layer
26 AlGaN electron supply layer
27 regrown layer
28 opening
28a wall surface of opening
28b bottom portion of opening
30 air layer
31, 31a insulating layer ($SiO_2$)
31h opening of insulating layer 32 i-type GaN layer or GaN-based semiconductor having band gap larger than that of GaN
D drain electrode
G gate electrode
M1, M2 resist pattern
S source electrode

The invention claimed is:

1. A vertical semiconductor device including a GaN-based stacked layer having an opening,
   the GaN-based stacked layer including n-type GaN-based drift layer/p-type GaN-based barrier layer/n-type GaN-based contact layer in that order to a top layer side of the semiconductor device, the opening extending from a top layer and reaching the n-type GaN-based drift layer, the semiconductor device comprising:
   a regrown layer located so as to cover the opening, the regrown layer including an electron drift layer and an electron supply layer;
   a source electrode located around the opening so as to be in contact with the n-type GaN-based contact layer, the regrown layer, and the p-type GaN-based barrier layer;
   a drain electrode located so as to have the center corresponding to the center of the opening, the drain electrode and the source electrode sandwiching the GaN-based stacked layer; and
   a gate electrode located on the regrown layer,
   wherein, assuming that the source electrode serving as one electrode, the drain electrode serving as the other electrode, and a dielectric material disposed therebetween constitute a capacitor, the semiconductor device includes a capacitance-decreasing structure that decreases a capacitance of the capacitor,
   wherein, in the capacitance-decreasing structure, the GaN-based stacked layer is formed on a conductive GaN-based substrate; the drain electrode is located on the conductive GaN-based substrate; the source electrode and the conductive GaN-based substrate overlap each other when viewed in plan; the n-type GaN-based drift layer is disposed only in a region that includes a bottom portion of the opening; and a region around the n-type GaN-based drift layer is filled with a low dielectric constant material having a dielectric constant lower than that of the n-type GaN-based drift layer.

2. The semiconductor device according to claim 1, wherein the low dielectric constant material is at least one of air, an insulating layer, an undoped GaN-based semiconductor, and a GaN-based wide gap semiconductor having a band gap larger than that of the n-type GaN-based drift layer.

3. A vertical semiconductor device including a GaN-based stacked layer having an opening,
   the GaN-based stacked layer including n-type GaN-based drift layer/p-type GaN-based barrier layer/n-type GaN-based contact layer in that order to a top layer side of the semiconductor device, the opening extending from a top layer and reaching the n-type GaN-based drift layer, the semiconductor device comprising:
   a regrown layer located so as to cover the opening, the regrown layer including an electron drift layer and an electron supply layer;
   a source electrode located around the opening so as to be in contact with the n-type GaN-based contact layer, the regrown layer, and the p-type GaN-based barrier layer;
   a drain electrode located so as to have the center corresponding to the center of the opening, the drain electrode and the source electrode sandwiching the GaN-based stacked layer; and
   a gate electrode located on the regrown layer,
   wherein, assuming that the source electrode serving as one electrode, the drain electrode serving as the other electrode, and a dielectric material disposed therebetween constitute a capacitor, the semiconductor device includes a capacitance-decreasing structure that decreases a capacitance of the capacitor,
   wherein, in the capacitance-decreasing structure, the GaN-based stacked layer is formed on a high-resistance GaN-based substrate; and the drain electrode is located in the high-resistance GaN-based substrate so as to be disposed only in a region that includes a portion corresponding to a bottom portion of the opening when viewed in plan, the drain electrode being in contact with the n-type GaN-based drift layer.

4. The semiconductor device according to claim 3, wherein the drain electrode is located so as to have a portion exposed in a bottom surface of the high-resistance GaN-based substrate or the drain electrode is located so as not to have a portion exposed in a bottom surface of the high-resistance GaN-based substrate.

* * * * *